(12) United States Patent
Neser et al.

(10) Patent No.: US 11,094,121 B2
(45) Date of Patent: Aug. 17, 2021

(54) MOBILE APPLICATION FOR SIGNAGE DESIGN SOLUTION USING AUGMENTED REALITY

(71) Applicant: Current Lighting Solutions, LLC, East Cleveland, OH (US)

(72) Inventors: Morne Neser, Lachine (CA); Kenneth Craig Nemeth, Lachine (CA)

(73) Assignee: CURRENT LIGHTING SOLUTIONS, LLC, East Cleveland, OH (US)

( * ) Notice: Subject to any disclaimer, the term of this patent is extended or adjusted under 35 U.S.C. 154(b) by 0 days.

(21) Appl. No.: 16/189,391

(22) Filed: Nov. 13, 2018

(65) Prior Publication Data
US 2019/0295321 A1 Sep. 26, 2019

Related U.S. Application Data

(60) Provisional application No. 62/647,603, filed on Mar. 23, 2018.

(51) Int. Cl.
| | |
|---|---|
| *G06T 19/00* | (2011.01) |
| *G06F 30/00* | (2020.01) |
| *G06T 19/20* | (2011.01) |
| *G09F 7/00* | (2006.01) |

(52) U.S. Cl.
CPC ............ *G06T 19/006* (2013.01); *G06F 30/00* (2020.01); *G06T 19/20* (2013.01); *G06T 2219/2016* (2013.01); *G09F 7/00* (2013.01)

(58) Field of Classification Search
CPC .................. G06T 19/006; G06T 19/20; G06T 2219/2016; G09F 7/00; G06F 30/00
See application file for complete search history.

(56) References Cited

U.S. PATENT DOCUMENTS

| | | | |
|---|---|---|---|
| 9,761,200 B2 * | 9/2017 | Kawashimo | ............. G09G 5/12 |
| 10,225,360 B1 * | 3/2019 | Sosna | ..................... G06Q 10/10 |
| 10,419,566 B2 * | 9/2019 | Sosna | .................. H04L 67/2804 |
| 2002/0115508 A1 * | 8/2002 | Bourdages | .......... G09F 15/0025 |
| | | | 473/476 |
| 2002/0198892 A1 * | 12/2002 | Rychel | ................. G06Q 10/087 |
| 2003/0195802 A1 * | 10/2003 | Hensen | .................. G06Q 30/02 |
| | | | 705/14.4 |

(Continued)

*Primary Examiner* — Abderrahim Merouan
(74) *Attorney, Agent, or Firm* — Buckley, Maschoff & Talwalkar LLC

(57) ABSTRACT

A method of generating an augmented reality (AR) signage solution including acquiring an image of a structure, establishing scaling information for the image by correlating dimensional information of the structure to points in the image, obtaining jurisdictional signage rules, designing a layout for signage on the structure in compliance with the jurisdictional signage rules, depicting in AR the acquired image and signage layout, and generating production documentation after obtaining user approval. The method including detecting the location of one or more obstructions on the structure and incorporating the obstruction locations in the signage layout. The method including adjusting the orientation of the acquired structure image within the AR to reduce skew of the structure in relation to a viewing perspective. A system and non-transitory computer-readable medium are also disclosed.

20 Claims, 3 Drawing Sheets

(56) References Cited

U.S. PATENT DOCUMENTS

| | | | | |
|---|---|---|---|---|
| 2005/0166434 | A1* | 8/2005 | Barlow | G09F 27/00 40/610 |
| 2008/0154686 | A1* | 6/2008 | Vicino | G06Q 20/10 705/313 |
| 2008/0307454 | A1* | 12/2008 | Ahanger | G06Q 30/02 725/36 |
| 2009/0176558 | A1* | 7/2009 | Englman | G07F 17/3244 463/25 |
| 2011/0295683 | A1* | 12/2011 | Mak | G06Q 30/02 705/14.49 |
| 2012/0123830 | A1* | 5/2012 | Svendsen | G06Q 30/0252 705/14.5 |
| 2012/0253939 | A1* | 10/2012 | Grigoriev | G06Q 30/0251 705/14.61 |
| 2013/0254349 | A1* | 9/2013 | Zaccagnino | H04L 67/32 709/219 |
| 2013/0332279 | A1* | 12/2013 | Kuusela | G06Q 30/02 705/14.57 |
| 2015/0071555 | A1* | 3/2015 | D'Antoni | G06F 21/6218 382/209 |
| 2015/0242706 | A1* | 8/2015 | Brown | G06F 16/5866 382/224 |
| 2016/0078487 | A1* | 3/2016 | Gevaldig | G06Q 30/0261 705/14.58 |
| 2016/0092069 | A1* | 3/2016 | Kelly | G07F 17/3223 463/25 |
| 2016/0104274 | A1* | 4/2016 | Jovanovski | G05B 19/402 348/46 |
| 2016/0239871 | A1* | 8/2016 | Yu | G06Q 30/0264 |
| 2017/0124774 | A1* | 5/2017 | Silverman | G06Q 30/0284 |
| 2017/0127148 | A1* | 5/2017 | Kondo | G06F 13/00 |
| 2017/0162177 | A1* | 6/2017 | Lebeck | G06F 21/6218 |
| 2017/0358048 | A1* | 12/2017 | Kotake | G06T 7/74 |
| 2018/0013977 | A1* | 1/2018 | Martineau | G06Q 30/0641 |
| 2018/0018714 | A1* | 1/2018 | Uhalley | G06Q 30/0264 |
| 2019/0230177 | A1* | 7/2019 | Sosna | G06Q 10/10 |
| 2019/0340551 | A1* | 11/2019 | Moore | G06Q 10/06313 |
| 2020/0020308 | A1* | 1/2020 | Deering | H04N 7/0117 |

* cited by examiner

MOBILE APPLICATION FOR SIGNAGE DESIGN SOLUTION USING AUGMENTED REALITY

CLAIM OF PRIORITY

This patent application claims, under 35 U.S.C. § 119(e), the priority benefit of U.S. Provisional Patent Application Ser. No. 62/647,603, filed Mar. 23, 2018, titled "Mobile Application for Signage Design Using Augmented Reality" the entire disclosure of which is incorporated herein by reference.

BACKGROUND

Conventional approaches for designing and selling signage can be time-consuming and error-prone, resulting in inefficiencies and loss to signage vendors. Some customers might not fully appreciate the as-installed appearance or placement of signage until after its manufacture, purchase, and installation. There is a need for improved methods and systems for designing, implementing, and simulating the placement of signage upon buildings or structures that can solve some or all of the aforementioned problems.

DETAILED DESCRIPTION

Embodying systems and methods provide for the design and augmented reality visualization of signage on the exterior of a building. Systems and methods can be embodied as a mobile signage application on a mobile computing device (e.g., tablet, mobile phone, portable computer, dedicated tool, or other device). Implemented as a mobile app, embodying systems and methods can provide a remote site signage design tool. In accordance with embodiments, multiple individual signage designs can be aggregated as part of an augmented reality visualization. This augmented reality visualization is superimposed on the building or structure so that the overall signage presentation for a site can be visually presented for evaluation.

The terms "building", "structure", and "building/structure" as used herein refer to the object upon which the signage is to be installed. Within this disclosure, these terms are used interchangeably without distinction.

In accordance with embodiments, the signage application can activate a camera, imaging device, and/or other sensor on the mobile computing device. The signage application can be remote or local to the mobile computing device. The imaging device is used to gather information on the building or structure upon which the signage will be designed and placed. By way of overview, the signage application can capture photographic or video images of a building or other object (exterior and/or interior). Location information on the building/structure can be obtained by the signage application accessing a position location system of the mobile computing device (e.g., global positioning system (GPS), or other location service). This positional information can be enhanced by utilizing available cellular communication system or wireless internet (Wi-Fi) networks.

In an exemplary embodiment, the captured imaging may form the background for an augmented reality (AR) display on the mobile device. This AR may be of a two-dimension or 3D form. The background of an AR display which shows the object, will form the backdrop upon which an image of the signage to be designed, will be superimposed.

Figure 1:
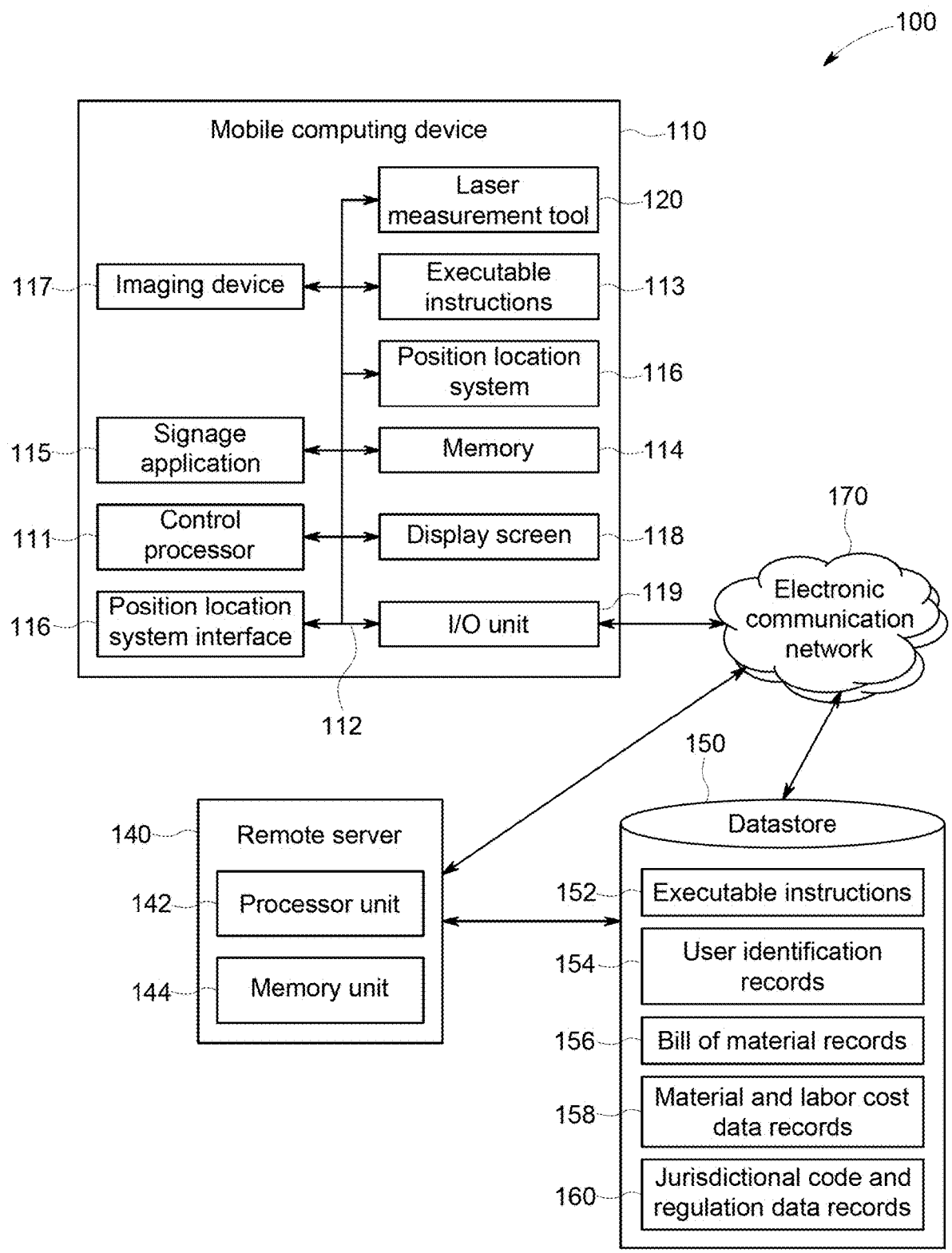
FIG. 1 depicts a system for implementing an augmented reality signage application in accordance with embodiments.

FIG. 1 depicts system 100 for implementing an augmented reality signage application in accordance with embodiments. An embodying system includes mobile computing device 110, which can include control processor 111 that communicates with other components of the mobile device over internal data/control bus 112. Control processor 111 accesses executable instructions 113, which can be stored in memory 114 to implement signage application 115. The control processor may be a processing unit, a field programmable gate array, discrete analog circuitry, digital circuitry, an application specific integrated circuit, a digital signal processor, a reduced instruction set computer processor, etc.

The mobile computing device can include input/output (I/O) unit 119 that communicates across electronic communication network 170. I/O unit 119 can support one or more hardwire and/or wireless communication protocols including, but not limited to, cellular telephone protocol, Bluetooth, low energy Bluetooth, iBeacon, near field communication, Airplay, etc.

Mobile computing device 110 can include imaging device 117 (e.g., a camera or other image capture device). An image captured by imaging device 117 can be displayed on display screen 118. The captured image can be a still photograph or a video. Laser measurement tool 120 can provide accurate dimensional information on the building/structure. The laser tool can be internal to the mobile computing device, a plug and play component accessible through a port, or a standalone unit that provides data to the mobile computing device.

Position location system interface 116 receives signals and determines the position of the mobile device based on the received signals. The positional location of the building/structure for which the sign is being designed can be located using the information from positional location system interface 116. This information can be used to obtain dimensional information on the layout of the structure (width, depth, architectural footprint).

Electronic communication network 170 can be, can comprise, or can be part of, a private internet protocol (IP) network, the Internet, an integrated services digital network (ISDN), integrated services digital network (ISDN), a modem connected to a phone line, a public switched telephone network (PSTN), a public or private data network, a local area network (LAN), a metropolitan area network (MAN), a wide area network (WAN), a wireline or wireless network, a local, regional, or global communication network, an enterprise intranet, any combination of the preceding, and/or any other suitable communication infrastructure. It should be recognized that techniques and systems disclosed herein are not limited by the nature of electronic communication network 170.

System 100 can include remote server 140 in communication with data store 150. The remote server can be in direct communication with the data store, or in indirect communication across electronic communication network 170. Processor unit 142 can execute executable instructions 152, which cause the processor to perform operations including, but not limited to, signage design, specification, layout, and augmented reality visualization. Memory unit 144 can provide the control processor with local cache memory.

Datastore 150 can include a repository of data records including user identification records 154, bill-of-material records 156, material and labor cost data records 158, and jurisdictional code and regulation records 160.

In accordance with embodiments, the signage application, data store content, and other components can all be local to a mobile computing device with sufficient on-board computing power and memory to accommodate operations and data storage requirements. In some implementations the components and data elements of system 100 can be distributed between the mobile computing device, the data store, and one or more remote servers.

An embodying method can gather end user or customer data (e.g., including login identity, password, contact information, site information, etc.). This information can be annotated or included in the signage production package generated by the signage application for reference back to the proper customer, and building/structure details. Information relating to the end user or customer may be stored user identification records 154, which can be accessed by the signage application for inclusion in the resultant design file(s).

Figure 2:
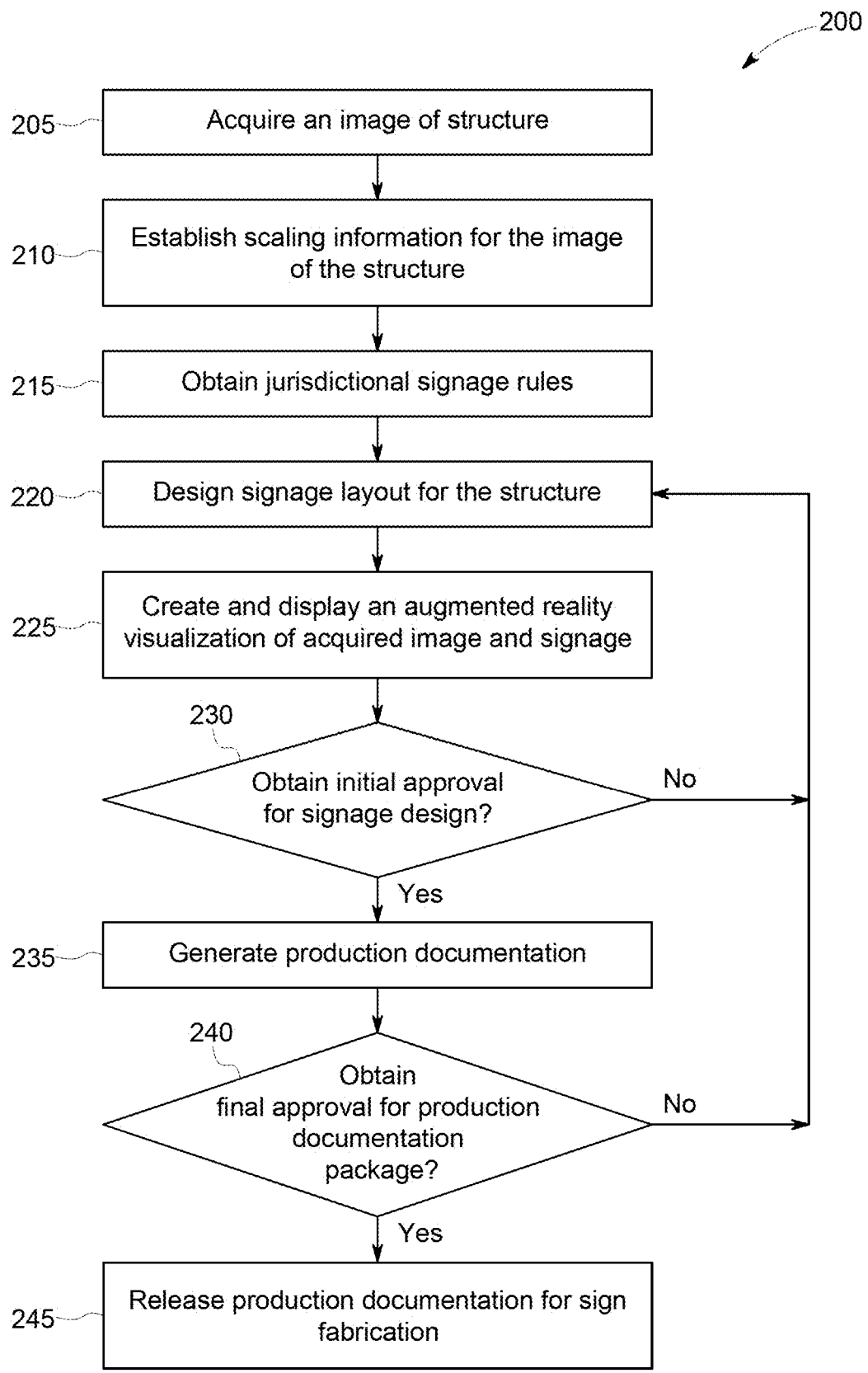
FIG. 2 depicts a process for generating an augmented reality signage image in accordance with embodiments.

FIG. 2 depicts process 200 for generating an augmented reality signage image in accordance with embodiments. An image of the building/structure upon which the signage is to be installed is acquired, step 205. Signage application 115 can activate imaging device 117 (e.g., a camera, infrared sensor, and/or other imaging device or sensor). The captured image can be a still (photographic) image or a video image of the building/structure.

Scaling information for the image is established, step 210. Scaling refers to obtaining dimensional information for the physical structure and correlating the dimensional information to points on the image. In accordance with embodiments, scaling can be performed by one, or a combination of, several approaches. For example, (1) the image scale can be acquired by a user inputting the building's dimensions; or (2) by using laser measurement tool 120, which in some implementations can be a component of the mobile computing device and in other implementations can be a device in communication with the mobile computing device; or (3) by utilizing mapping software in communication with the signage application; or (4) by calibration against an object of known size; or (5) by any combination of these and other approaches.

As an example, data from mapping software may be employed by the signage application to identify features (e.g., width, depth) of the building identifiable from a mapping image of the building—such as a top-down view of the building. A calculation derived from the features identified by the application taken in combination with the mapping data can provide the distance of the mobile device to the building. Knowing the positional location of the mobile computing device and the positional location of the building can be used to derive a positional relation between the device and building. This positional relation can be used to determine image perspective that can be used when scaling the image. In some implementations, scaling information can be established by including within the field-of-view of the imaging device an object of known dimension prior to capturing the image. Inclusion of an object of known dimension can be used to obtain scaling factors that can be applied to the building dimensions. This dimensionally-known object can be a dimensionally-marked placard, measurement stick, surveyor markings, QR code target, and other items. In some implementations, machine learning can be used to analyze the building image for features of known dimensions (e.g., standard sized doorways, windows, etc.).

Location information of the building/structure can be obtained by the signage application accessing position location system 116. This obtained positional information can be enhanced by utilizing available cellular communication system or wireless internet (Wi-Fi) networks.

In some implementations, a user can enter dimensional data for scaling the image. A user insert a line into the image as it is presented on display 118 (using a pointer device, or touch screen capability). The line can have two draggable endpoints that are positioned by the user to correspond to points on the building image, where the user knows the separation distance. The user can then enter the separation dimension.

Data pertaining to jurisdictional signage rules (e.g., constraints and/or requirements) can be obtained, step 215. This information can be obtained by querying remote servers, or from jurisdictional code and regulation data records 160. These signage rules can vary between municipalities, communities, private building associations, and landlords. Jurisdictional signage rules refers broadly to laws, by-laws, rules, regulations (e.g., zoning regulation), covenants, agreements, standards, or any other legally relevant restrictions that may exist on the use and application of signage on a building. These jurisdictional rules or standards can be applied to the design of the sign. For example, restrictions can relate to whether or not a sign may be placed on a building at all, or if permitted, what sizes, shapes, colors, brightness, and/or appearance regulations may circumscribe or limit the sign.

In accordance with embodiments, signage application 115 can interrogate a remote server by supplying the building's positional coordinates, street address, zoning map identifiers, or other unique identifying data. Alternatively, the relevant information can be obtained from interrogating jurisdictional code and regulation data records on the data store.

The signage design can be created, step 220. The design can include details on the content of the sign (wording, image, logo, etc.) and the type of sign (e.g., channel lettering, box sign, backlight sign, neon sign, etc.). In accordance with embodiments, the signage application can analyze the obtained image to detect and/or identify obstacles that can obstruct the placement of the signage—e.g., windows or doors, protruding equipment, balconies, porticos, etc. Identification of such obstacles can preclude placement of a sign in an ill-advised location.

The signage application can include machine-learning components configured to detect such obstacles in the acquired images/video. In some implementations, the signage application can be in communication with a remotely-hosted machine-learning. Such machine-learning routines may be configured to determine the placement or locations of signs that are physically reasonable. In some embodiments, a user of the signage application can be provided an ability to confirm that the obstacles identified by machine-learning routine are correctly identified.

A user can enter specification data for a desired sign, such as its dimensions, color, image content, font, brightness, combinations thereof, etc. In some implementations the user-specified details can be stored in data store records. In some embodiments, the signage application can generate two- or three-dimensional models representing a sign conforming to the specifications. It should be readily understood that multiple models representing different signs can be generated. For example, consideration of multiple signage located on a rooftop, above a doorway, on the building face, etc. can each have a model generated.

An augmented reality visualization of the building and sign is created, step 225. The augmented reality visualization provides the user an opportunity to view a rendering of the signage as it would appear installed, prior to the ordering and manufacturing of the signage. The user can use this opportunity to provide feedback and additional detail on the sign design during its design process.

The signage application can superimpose the signage model(s) onto the acquired building image using augmented reality. Signage application can include components that detect the building orientation in the acquired image. These components can adjust the orientation of the building in the augmented reality rendition to reduce skew in the image relative to a viewing perspective (e.g., from off-normal to a front-facing view). Adjusting the building orientation can facilitate the augmented reality placement of signage at a correct angle or position.

Figure 3:
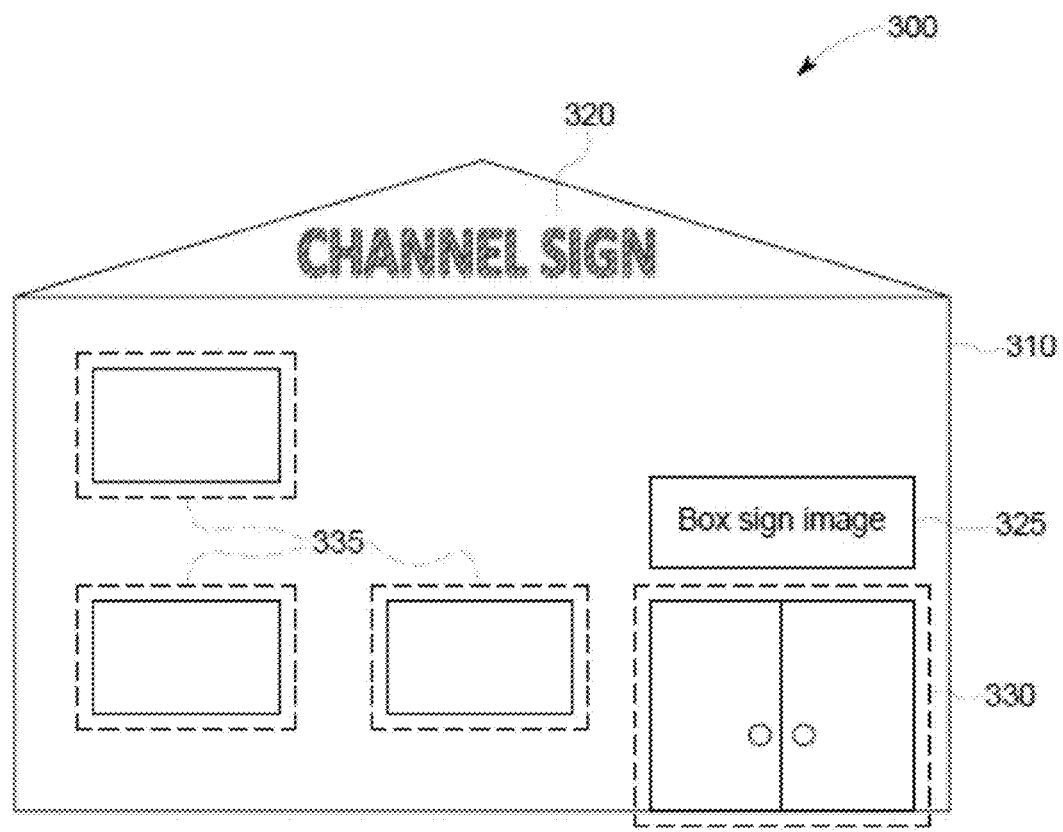
FIG. 3 depicts an augmented reality visualization in accordance with embodiments.

FIG. 3 depicts augmented reality visualization 300 in accordance with embodiments. Visualization 300 includes building image 310. This building image is a real-world captured image (step 205). In some implementations, building image 310 can be architectural or artist renderings of the building. Superimposed on building image 310 are channel sign 320 and box sign 325. Signs 320, 325 are designed for the structure (step 220) and superimposed on the building image by using augmented reality techniques. Doorway 330 and windows 335 are identified obstructions (step 220).

In accordance with embodiments, the signage application can accept user input to manipulate the image of a sign within the augmented reality visualization as it is being displayed on display screen 118. The user can move the sign around the design space, remove, and alter the sign using touch gestures and/or a pointing device.

In accordance with embodiments, the signage application can enhance the augmented reality by altering its lighting, contrast (e.g., alter brightness of the building and signage in different directions or increments), brightness, coloring, etc. to simulate day, night, sunny or cloudy or other conditions.

At step 230 a determination is made on whether the sign design is approved. If the design is not approved, process 200 returns to step 220 to adjust the signage design. If the design is approved, process 200 continues to step 235.

The signage application can generate production documentation, step 235. The production documents represent a summary of the designed signed, including data outputs that enable the physical manufacture of the designed signage. The signage application may generate (or cause to be generated) a complete bill-of-materials (BOM) of the designed signage, which can be stored in BOM records 156. The BOM may comprise lists of parts needed for manufacture of the sign, which may include raw material lists, number and type of light sources, electrical wiring, brackets, fasteners, etc. The generated documentation can include pricing estimates, purchase orders, technical drawings, manufacturing scheduling estimates and milestones, installation details and instruction, etc. Information on material and labor costs can be obtained from material and labor cost data records 158. Documentation can also include a contact-list of approved distributors, builders, installers, or sales channels.

In accordance with embodiments, a user can generate production documentation including all the technical drawings, BOMs, and costs for each sign in the building design. This can be accomplished via a server to which the signage application sends the signage design specifications, and from which receives files containing production drawings and BOMs. The user/customer can browse the files and review a summary file detailing the materials required.

At step 240 a determination is made on whether the production documentation is approved. If not approved, process 200 returns to step 220 to adjust the signage design. If the documentation is approved, process 200 continues to step 245.

Once approved, the production documentation can be released, step 245, for fabrication of the signage. In accordance with embodiments, one or more pieces of production documentation can be provided to a remote design server that can generate schematics for wiring of a lighted sign.

In accordance with some embodiments, a computer program application stored in non-volatile memory or computer-readable medium (e.g., register memory, processor cache, RAM, ROM, hard drive, flash memory, CD ROM, magnetic media, etc.) may include code or executable program instructions that when executed may instruct and/or cause a controller or processor to perform methods discussed herein such as a method for generating an augmented reality signage image, as disclosed above.

The computer-readable medium may be a non-transitory computer-readable media including all forms and types of memory and all computer-readable media except for a transitory, propagating signal. In one implementation, the non-volatile memory or computer-readable medium may be external memory.

Although specific hardware and methods have been described herein, note that any number of other configurations may be provided in accordance with embodiments of the invention. Thus, while there have been shown, described, and pointed out fundamental novel features of the invention, it will be understood that various omissions, substitutions, and changes in the form and details of the illustrated embodiments, and in their operation, may be made by those skilled in the art without departing from the spirit and scope of the invention. Substitutions of elements from one embodiment to another are also fully intended and contemplated. The invention is defined solely with regard to the claims appended hereto, and equivalents of the recitations therein.

The invention claimed is:

1. A method of generating an augmented reality signage solution, by a computing device, the method comprising:
    acquiring an image of a structure, the structure being a candidate for installation of physical signage at a fixed location;
    establishing scaling information for the structure depicted in the image;
    obtaining jurisdictional signage rules from a data store of at least one of jurisdictional code and regulation records for a jurisdiction in which the structure is located in response to the acquiring of the image of the structure;
    designing a layout for signage in compliance with the jurisdictional rules, the signage to be installed at the fixed location on the structure, wherein the designing of the layout comprises:
        detecting an obstructed location of one or more obstructions on the structure, and
        incorporating the obstructed location of the one or more obstructions in the signage layout;
    creating an augmented reality visualization depicting the acquired image and the signage design layout; and
    generating production documentation for the signage design layout.

2. The method of claim 1, including:
obtaining an initial approval for the signage design layout prior to generating the production documentation; and
if the initial approval is denied, then repeating the designing and creating steps.

3. The method of claim 1, including:
obtaining a final approval for the signage design layout after generating the production documentation;
if the final approval is denied, then repeating the designing and creating steps; and
else releasing at least a portion of the production documentation to a sign fabricator.

4. The method of claim 1, the establishing scaling information including correlating dimensional information of the structure to points in the image.

5. The method of claim 4, including obtaining the dimensional information from at least one of user input, a laser measurement tool, mapping software, and an object of known size in the image.

6. The method of claim 1, including obtaining the jurisdictional signage rules from at least one of a remote server and a local data store.

7. The method of claim 1, designing the signage layout including:
detecting the location of one or more obstructions on the structure; and
incorporating the location of the one or more obstructions in the signage layout.

8. The method of claim 1, creating the augmented reality visualization including adjusting the orientation of the structure within the acquired image to reduce skew of the structure in relation to a viewing perspective.

9. A non-transitory computer-readable medium containing executable instructions that when executed by a processor cause the processor to perform a method of generating an augmented reality signage solution, the method comprising:
acquiring an image of a structure, the structure being a candidate for installation of physical signage at a fixed location;
establishing scaling information for the structure depicted in the image;
obtaining jurisdictional signage rules from a data store of at least one of jurisdictional code and regulation records for a jurisdiction in which the structure is located in response to the acquiring of the image of the structure;
designing a layout for signage in compliance with the jurisdictional rules, the signage to be installed at the fixed location on the structure, wherein the designing of the layout comprises:
detecting an obstructed location of one or more obstructions on the structure, and
incorporating the obstructed location of the one or more obstructions in the signage layout;
creating an augmented reality visualization depicting the acquired image and the signage design layout; and
generating production documentation for the signage design layout.

10. The non-transitory computer-readable medium of claim 9, the executable instructions causing the processor to perform the method, including:
obtaining an initial approval for the signage design layout prior to generating the production documentation; and
if the initial approval is denied, then repeating the designing and creating steps.

11. The non-transitory computer-readable medium of claim 9, the executable instructions causing the processor to perform the method, including:
obtaining a final approval for the signage design layout after generating the production documentation;
if the final approval is denied, then repeating the designing and creating steps; and
else releasing at least a portion of the production documentation to a sign fabricator.

12. The non-transitory computer-readable medium of claim 9, the executable instructions causing the processor to establish scaling information by correlating dimensional information of the structure to points in the image.

13. The non-transitory computer-readable medium of claim 12, the executable instructions causing the processor to obtain the dimensional information from at least one of user input, a laser measurement tool, mapping software, and an object of known size in the image.

14. The non-transitory computer-readable medium of claim 9, the executable instructions causing the processor to obtain the jurisdictional signage rules from at least one of a remote server and a local data store.

15. The non-transitory computer-readable medium of claim 9, the executable instructions causing the processor to obtain the signage layout by:
detecting the location of one or more obstructions on the structure; and
incorporating the location of the one or more obstructions in the signage layout.

16. The non-transitory computer-readable medium of claim 9, the executable instructions causing the processor to create the augmented reality visualization by adjusting the orientation of the structure within the acquired image to reduce skew of the structure in relation to a viewing perspective.

17. A system for generating an augmented reality signage solution, the system comprising:
a mobile computing device having components in communication across an internal bus;
the components including:
a signage application in communication with a control processor, a position locating system, a memory, and executable instructions;
the executable instruction when executed by the processor cause the processor to perform a method comprising:
acquiring an image of a structure, the structure being a candidate for installation of physical signage at a fixed location;
establishing scaling information for the structure depicted in the image;
obtaining jurisdictional signage rules from a data store of at least one of jurisdictional code and regulation records for a jurisdiction in which the structure is located in response to the acquiring of the image of the structure;
designing a layout for signage in compliance with the jurisdictional rules, the signage to be installed at the fixed location on the structure, wherein the designing of the layout comprises:
detecting an obstructed location of one or more obstructions on the structure, and
incorporating the obstructed location of the one or more obstructions in the signage layout;
creating an augmented reality visualization depicting the acquired image and the signage design layout; and generating production documentation for the signage design layout.

18. The system of claim 17, the executable instructions causing the processor to:
  establish scaling information by correlating dimensional information of the structure to points in the image; and
  obtain the dimensional information from at least one of user input, a laser measurement tool, mapping software, and an object of known size in the image.

19. The system of claim 17, the executable instructions causing the processor to obtain the signage layout by:
  detecting the location of one or more obstructions on the structure; and
  incorporating the location of the one or more obstructions in the signage layout.

20. The system of claim 17, the executable instructions causing the processor to create the augmented reality visualization by adjusting the orientation of the structure within the acquired image to reduce skew of the structure in relation to a viewing perspective.

* * * * *